US 8,563,352 B2

(12) United States Patent
Hiliali et al.

(10) Patent No.: US 8,563,352 B2
(45) Date of Patent: Oct. 22, 2013

(54) CREATION AND TRANSLATION OF LOW-RELIEF TEXTURE FOR A PHOTOVOLTAIC CELL

(75) Inventors: Mohamed M. Hiliali, Sunnyvale, CA (US); S. Brad Herner, San Jose, CA (US)

(73) Assignee: GTAT Corporation, Nashua, NH (US)

(*) Notice: Subject to any disclaimer, the term of this patent is extended or adjusted under 35 U.S.C. 154(b) by 860 days.

(21) Appl. No.: 12/750,635

(22) Filed: Mar. 30, 2010

(65) Prior Publication Data

US 2010/0184248 A1 Jul. 22, 2010

Related U.S. Application Data

(63) Continuation-in-part of application No. 12/026,530, filed on Feb. 5, 2008, now Pat. No. 8,481,845.

(51) Int. Cl.
*H01L 31/0236* (2006.01)
(52) U.S. Cl.
USPC ........................................ 438/71; 257/E31.13
(58) Field of Classification Search
USPC ........................................ 438/71; 257/E31.13
See application file for complete search history.

(56) References Cited

U.S. PATENT DOCUMENTS

| 3,411,952 A | 11/1968 | Bernd et al. |
| 3,480,473 A | 11/1969 | Tanos |
| 4,084,985 A | 4/1978 | Evans, Jr. |
| 4,144,096 A | 3/1979 | Wada et al. |
| 4,171,997 A | 10/1979 | Irmler |
| 4,174,561 A | 11/1979 | House et al. |
| 4,200,472 A | 4/1980 | Chappell et al. |
| 4,240,842 A | 12/1980 | Lindmayer |
| 4,315,097 A | 2/1982 | Solomon |
| 4,338,481 A | 7/1982 | Mandelkorn |

(Continued)

FOREIGN PATENT DOCUMENTS

| JP | 2001077044 A | 3/2001 |
| JP | 2003017723 | 1/2003 |
| JP | 2007250575 A | 9/2007 |

OTHER PUBLICATIONS

Office Action dated Dec. 11, 2012 for U.S. Appl. No. 12/026,530.

(Continued)

*Primary Examiner* — Nadine Norton
*Assistant Examiner* — Mahmoud Dahimene
(74) *Attorney, Agent, or Firm* — The Mueller Law Office, P.C.

(57) ABSTRACT

Low-relief texture can be created by applying and firing frit paste on a silicon surface. Where frit contacts the surface at high temperature, it etches silicon, dissolving silicon in the softened glass frit. The result is a series of small, randomly located pits, which produce a near-Lambertian surface, suitable for use in a photovoltaic cell. This texturing method consumes little silicon, and is advantageously used in a photovoltaic cell in which a thin silicon lamina comprises the base region of the cell. When the lamina is formed by implanting ions in a donor wafer to form a cleave plane and cleaving the lamina from the donor wafer at the cleave plane, the ion implantation step will serve to translate texture formed at a first surface to the cleave plane, and thus to the second, opposing surface following cleaving. Low-relief texture formed by other methods can be translated from the first surface to the second surface in this way as well.

20 Claims, 15 Drawing Sheets

(56) References Cited

U.S. PATENT DOCUMENTS

| | | | |
|---|---|---|---|
| 4,450,472 | A | 5/1984 | Tuckerman et al. |
| 4,499,658 | A | 2/1985 | Lewis |
| 4,578,526 | A | 3/1986 | Nakano et al. |
| 4,830,038 | A | 5/1989 | Anderson et al. |
| 4,836,861 | A | 6/1989 | Peltzer et al. |
| 4,897,123 | A | 1/1990 | Mitsui |
| 5,034,068 | A | 7/1991 | Glenn et al. |
| 5,057,163 | A | 10/1991 | Barnett et al. |
| 5,273,911 | A | 12/1993 | Sasaki et al. |
| 5,279,682 | A | 1/1994 | Wald et al. |
| 5,374,564 | A | 12/1994 | Bruel |
| 5,626,688 | A | 5/1997 | Probst et al. |
| 5,966,620 | A | 10/1999 | Sakaguchi et al. |
| 5,985,742 | A | 11/1999 | Henley et al. |
| 6,048,411 | A | 4/2000 | Henley et al. |
| 6,107,213 | A | 8/2000 | Tayanaka |
| 6,146,979 | A | 11/2000 | Henley et al. |
| 6,184,111 | B1 | 2/2001 | Henley et al. |
| 6,190,937 | B1 | 2/2001 | Nakagawa et al. |
| 6,225,192 | B1 | 5/2001 | Aspar et al. |
| 6,229,165 | B1 | 5/2001 | Sakai et al. |
| 6,262,358 | B1 | 7/2001 | Kamimura et al. |
| 6,331,208 | B1 | 12/2001 | Nishida et al. |
| 6,403,877 | B2 | 6/2002 | Katsu |
| 6,500,690 | B1 | 12/2002 | Yamagishi et al. |
| 6,518,596 | B1 | 2/2003 | Basore |
| 6,530,653 | B2 | 3/2003 | Le et al. |
| 6,534,382 | B1 | 3/2003 | Sakaguchi et al. |
| 6,563,133 | B1 | 5/2003 | Tong |
| 6,690,014 | B1 | 2/2004 | Gooch et al. |
| 6,825,104 | B2 | 11/2004 | Horzel et al. |
| 7,019,339 | B2 | 3/2006 | Atwater, Jr. et al. |
| 7,056,815 | B1 | 6/2006 | Weng et al. |
| 7,238,622 | B2 | 7/2007 | Atwater, Jr. et al. |
| 7,462,774 | B2 | 12/2008 | Roscheisen et al. |
| 7,591,712 | B2 * | 9/2009 | Morikawa et al. ............ 451/36 |
| 7,700,878 | B2 | 4/2010 | Antaya et al. |
| 2002/0132449 | A1 | 9/2002 | Iwasaki et al. |
| 2003/0134489 | A1 | 7/2003 | Schwarzenbach et al. |
| 2004/0200520 | A1 | 10/2004 | Mulligan et al. |
| 2004/0206390 | A1 | 10/2004 | Bhattacharya |
| 2005/0000561 | A1 | 1/2005 | Baret et al. |
| 2006/0021565 | A1 | 2/2006 | Zahler et al. |
| 2006/0208341 | A1 | 9/2006 | Atwater, Jr. et al. |
| 2007/0135013 | A1 | 6/2007 | Faris |
| 2007/0235074 | A1 | 10/2007 | Henley et al. |
| 2007/0277874 | A1 | 12/2007 | Dawson-Elli et al. |
| 2008/0018810 | A1 | 1/2008 | Moriiwa |
| 2008/0023061 | A1 | 1/2008 | Clemens et al. |
| 2008/0070340 | A1 | 3/2008 | Borrelli et al. |
| 2008/0160661 | A1 | 7/2008 | Henley |
| 2008/0179547 | A1 | 7/2008 | Henley |
| 2009/0042369 | A1 * | 2/2009 | Henley ........................ 438/463 |
| 2009/0061557 | A1 | 3/2009 | Akiyama et al. |
| 2009/0189126 | A1 * | 7/2009 | Prunchak ................ 252/519.51 |

OTHER PUBLICATIONS

Second Office Action dated Dec. 25, 2012 for Chinese Application No. 200910000496.1.
Office Action dated Nov. 26, 2010 for U.S. Appl. No 12/026,530.
Office Action dated Dec. 27, 2010 for U.S. Appl. No. 12/208,298.
Rinke, T.J., et al., "Quasi-monocrystalline silicon for thin-film devices", May 1999, Applied Physics A, DOI 10.1007/s003399900078, pp. 705-707.
Extended European Search Report filed on Feb. 21, 2011 for EPO Application No. 09152012.2.
Extended European Search Report filed on Feb. 21, 2011 for EPO Application No. 09152007.2.
Office Action dated Apr. 5, 2011 for U.S. Appl. No. 12/189,157.
Office Action dated Mar. 21, 2011 for U.S. Appl. No. 12/499,294.
Office Action for U.S. Appl. No. 12/026,530 dated Mar. 7, 2011.
Bergmann, et al. "Thin film solar cells on glass by transfer of monocrystalline Si films", 1999, International Journal of Photoenergy, ,vol. 1, pp. 1-5.
Notice of Allowance dated Apr. 6, 2012 for U.S. Appl. No. 12/343,420.
Office Action dated Mar. 1, 2012 for U.S. Appl. No. 12/499,294.
Brendel, Rolf, "Thin-film crystalline silicon mini-modules using porous Si for layer transfer", 2004, Solar Energy 77, pp. 969-982.
Notice of Allowance and Fees Due dated Jun. 19, 2012 for U.S. Appl. No. 12/499,294.
Office Action dated Jun. 13, 2012 for U.S. Appl. No. 12/208,298.
Office Action dated May 25, 2012 for U.S. Appl. No. 12/026,530.
Supplemental Notice of Allowance and Fees Due dated Jul. 19, 2012 for U.S. Appl. No. 12/499,294.
Amin, Nowshad et al., "Highly Efficient 1 Micron Thick CdTe Solar Cells with Textured TCOs", 2001, Solar Energy Materials & Solar Cells, 67, pp. 195-201.
Office Action dated Jul. 12, 2010 for U.S. Appl. No. 12/208,298.
Office Action dated Jul. 29, 2010 for U.S. Appl. No. 12/208,392.
Notice of Allowance and Fee(s) Due dated Oct. 19, 2010 for U.S. Appl. No. 12/208,392.
Notice of Allowance dated Nov. 14, 2011 for U.S. Appl. No. 12/189,157.
Office Action dated Aug. 24, 2011 for U.S. Appl. No. 12/189,157.
Office Action dated Nov. 14, 2011 for U.S. Appl. No. 12/343,420.
Office Action dated Oct. 28, 2011 for U.S. Appl. No. 12/499,294.
English Translation of JP 2003017723, Mar. 2013.
Notice of Allowance and Fees Due dated Mar. 21, 2013 for U.S. Appl. No. 12/026,530.
Office Action dated Apr. 1, 2013 for U.S. Appl. No. 12/208,298.
Agarwal et al. in *Efficient production of silicon-on-insulatOf films by co-implantation of He+ with H+, Amer. Inst. of Physics, vol. 72, No. 9, pp. 1086-1088, Mar. 1998.
De Ceuster et al., *low Cost, high volume production of >22% efficiency silicon solar cells: Proc. 22nd EUPVSEC, 2007, p. 816-819.
Griggs et al., "Design Approaches and Materials Processes for Ultrahigh Efficiency Lattice Mismatched Multi-junction Solar Cells," Proc. 4th WCPEC, Waikoloa, HA, 2006.
Mulligan et al., Reducing Silicon Consumption by Leveraging Cell Efficiency: Proc. 21st EUPVSEC, 2006, pp. 1301-1302.
Mulligan et al., "Manufacture of Solar Cens with 21% Efficency," http://www.sunpowercorp.comiSmarter-Solarfrhe-SunPower-Advantagef-fmediafDownloadslsmarter_solarlbmpaper.ashx.
Poortmans, Jeff et al., "Thin Film Solar Cells: Fabrication, Characterization and applications", 2006, John Wiley & Sons Ltd, p. 72.
Saadatmand et ar., Radiation Emission from Ion Implanters When Implanting Hydrogen and Deuterium: Proc. 1998 Inti. Conf. on Ion Implantation Tech., pp. 292-295, 1999.
Singh, Jasprit; Semiconductor Devices: Basic Principles: Chapter 7: John Wiley 2001.
Taguchi et al., An approach for the higher efficiency of HIT cells: Proc. IEEE-31, 31st IEEE Photovoltaics Spec. Conf., Orlando, USA, Jan 2005.
Tihu Wang, NREL (National Renewable Energy Laboratory) of US Department of Energy.
Zhao et al., "Twenty-four percent efficient silicon solar cells with double layer antireflection coatings and reduced resistance loss," Appl Phys. Lett. 66 (26) Jun. 1995.

* cited by examiner

Embodiment of 12/026530

Embodiment of 12/026530

Embodiment of 12/026530

Embodiment of 12/026530

CREATION AND TRANSLATION OF LOW-RELIEF TEXTURE FOR A PHOTOVOLTAIC CELL

RELATED APPLICATIONS

This application is a continuation-in-part of Sivaram et al., U.S. patent application Ser. No. 12/026,530, "Method to Form a Photovoltaic Cell Comprising a Thin Lamina," filed Feb. 5, 2008 owned by the assignee of the present application and hereby incorporated by reference.

BACKGROUND OF THE INVENTION

The invention relates to low-relief texture at the surface of a thin lamina for use in a photovoltaic cell, and methods of making If the light-facing surface of a photovoltaic cell is perfectly planar, a high proportion of incident light may be reflected from the surface rather than entering the cell to be absorbed and converted to electric current. A planar reflective back surface will also tend to reflect light back out of the cell. Adding texture to the light-facing surface, the back surface, or both surfaces of a photovoltaic cell such that they are not perfectly planar will tend to refract or reflect incident light in a way that may tend to increase the travel distance of light within the cell. Longer travel within the portion of the cell that absorbs light will generally improve conversion efficiency of the cell.

SUMMARY OF THE PREFERRED EMBODIMENTS

The present invention is defined by the following claims, and nothing in this section should be taken as a limitation on those claims. In general, the invention is directed to low-relief texture at the surface of a thin lamina for use in a photovoltaic cell and methods of making such texture.

A first aspect of the invention provides for method to form texture at a surface of a photovoltaic cell, the method comprising the steps of: applying a mixture containing glass frit to a first surface of a silicon body; firing the glass frit mixture, causing selective etching of silicon at the first surface; removing all of the fired glass frit, leaving the first surface textured; and fabricating the photovoltaic cell, wherein the photovoltaic cell comprises the textured first surface.

Another aspect of the invention provides for a method to texture opposing surfaces of a lamina, the method comprising the steps of: creating a first texture at a first surface of a donor body, wherein, for at least 50 percent of the area of the first surface, average peak-to-valley height is between about 100 nm and about 1500 nm, and average peak-to-peak distance is between about 140 nm and about 2100 nm; implanting ions through the textured first surface, thereby defining a cleave plane within the donor body; and cleaving the lamina from the donor body at the cleave plane, wherein the first surface of the donor body is a first surface of the lamina, and wherein a second surface of the lamina, the second surface opposite the first surface, is created by cleaving, and wherein, immediately following the cleaving step, the second surface has a second texture, wherein for at least 50 percent of the area of the second surface, average peak-to-valley height is between about 100 nm and about 1500 nm, and average peak-to-peak distance is between about 140 nm and about 2100 nm.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
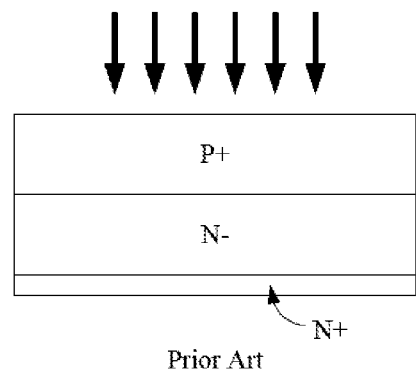
FIG. 1 is a cross-sectional view of a prior art photovoltaic cell.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a p+/n-junction (as shown in FIG. 1) or a n+/p-junction. The more lightly doped region is known as the base of the photovoltaic cell, while the more heavily doped region, of opposite conductivity type, is known as the emitter. The base is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
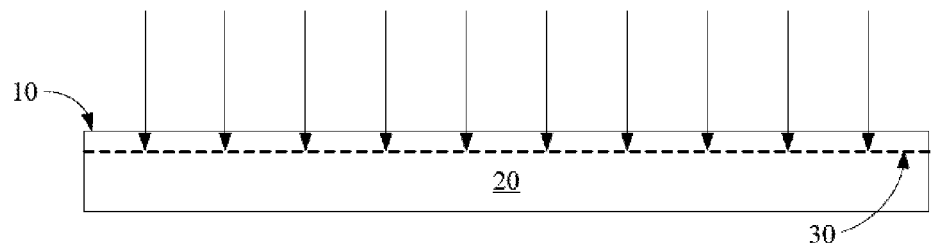
FIGS. 2a-2d are cross-sectional views of stages of fabrication of a photovoltaic cell formed according to an embodiment of U.S. patent application Ser. No. 12/026,530.
Figure 2B:
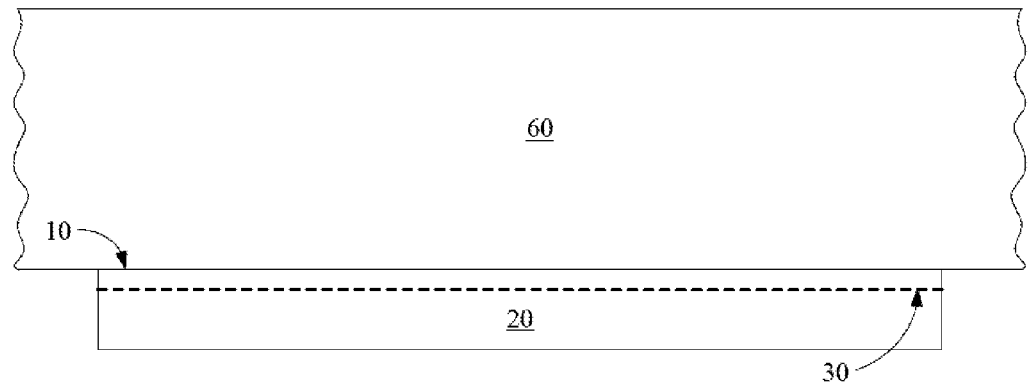
Figure 2C:
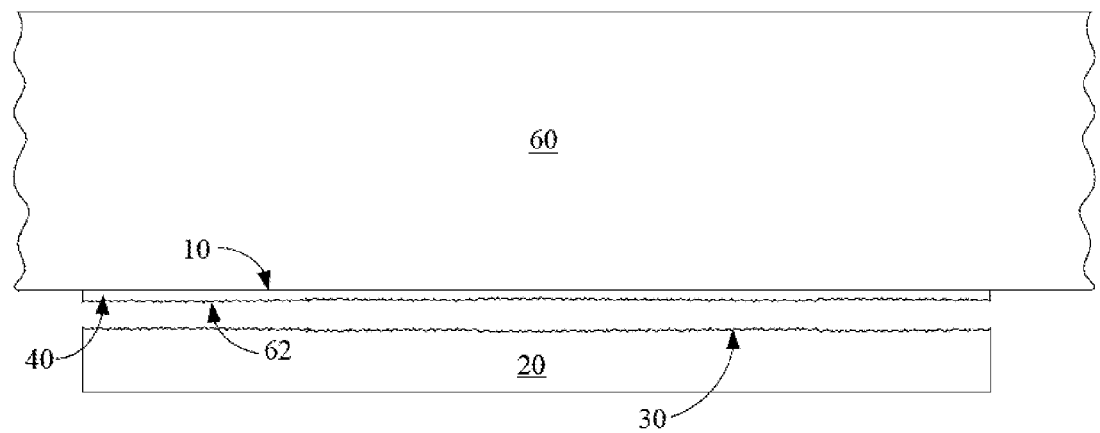
Figure 2D:
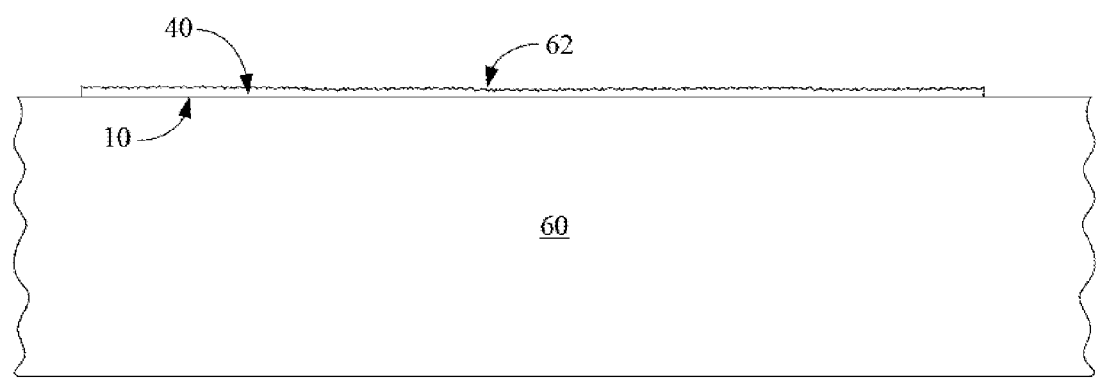

Sivaram et al., earlier incorporated, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted through first surface 10 with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

Using the methods of Sivaram et al., photovoltaic cells, rather than being formed from sliced wafers, are formed of thin semiconductor laminae without wasting silicon through kerf loss or by fabrication of an unnecessarily thick cell, thus reducing cost. The same donor wafer can provide multiple laminae, further reducing cost. The donor wafer may be resold after exfoliation of multiple laminae for some other use.

Figure 3A:
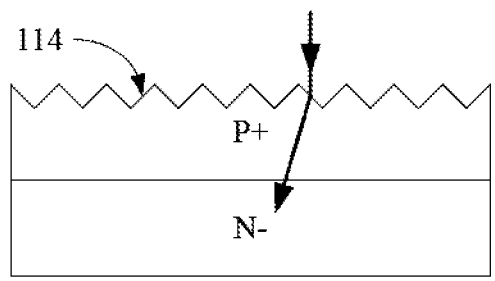
FIGS. 3a and 3b are cross-sectional views illustrating texturing the front or back surface of a photovoltaic cell to increase the travel length of light within the cell.
Figure 3B:
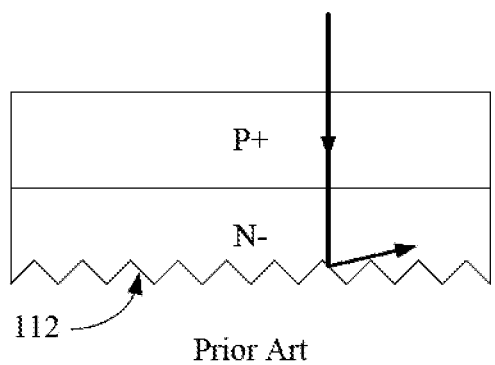

Some incident light may pass all the way through the cell without creating any electron-hole pairs, failing to generate any photocurrent and reducing the efficiency of the cell. To avoid allowing light to escape, typically the back surface of the cell is reflective, so that light that passes through the cell is reflected back into the cell from the back surface. Referring to FIG. 3a, it is also well known to texture front surface 114, which will cause incident light to be refracted, as shown. Alternatively back surface 112 may be textured, as in FIG. 3b, changing the angle of light upon reflection. Either technique serves to increase travel length of light within the cell, improving cell efficiency; often both front and back surfaces are textured. Ideally surface texturing will alter the path of light so that all or most light is internally reflected, and none escapes.

Frit is a small particle, typically a ceramic material which has been fused, quenched to form glass, and granulated or milled. Frit may be a metal oxide, and is not crystalline. A typical particle size for frit is five microns, though size may vary. Frit paste, a paste formulation with frit distributed through it, is conventionally used for many industrial purposes, including in fabrication of photovoltaic cells to form electrical contacts.

Figure 4A:
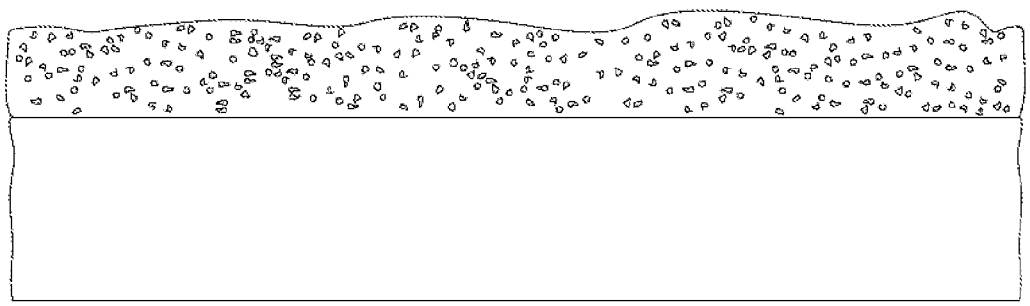
FIGS. 4a and 4b are cross-sectional views illustrating creation of advantageous texture by firing frit paste at a silicon surface according to embodiments of the present invention.

Many types of frit, when heated in contact with silicon, will etch the underlying silicon, dissolving the silicon in the softened glass frit. Aspects of the present invention take advantage of this characteristic. A frit paste is applied to a silicon surface, as in FIG. 4a. Note that frit is not shown to scale. Heating drives organics from the frit paste, rearranging the glass frit particles into a more compact structure.

Temperature is increased to a transition temperature, at which the frit becomes gel-like. At still higher temperature, the frit begins to flow under its own weight. Through capillary action, the frit, which is initially distributed throughout the paste, flows to the surface. Where fluid frit contacts silicon, it etches the silicon surface at the point of contact, forming pits at the surface. Other areas of the silicon surface are unaffected. The formulation of the frit, the paste, the firing temperature, and the duration of firing all affect the diameter, depth, and density of pits.

Figure 4B:
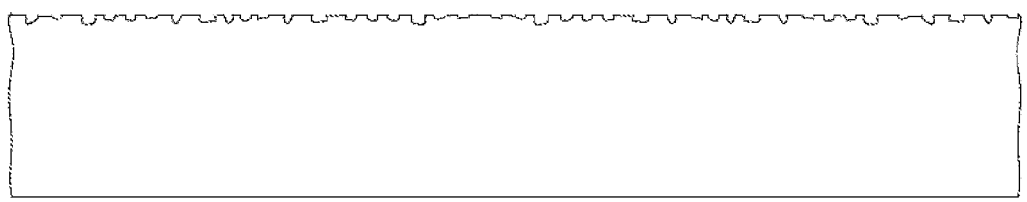

During cooling, most of the dissolved silicon recrystallizes inside the glass frit, which is then removed, for example, by a hydrofluoric (HF) acid dip. Some of the dissolved silicon may oxidize. The process leaves behind a randomly pitted silicon surface, shown in FIG. 4b. The pit size is exaggerated for visibility. The depth of the pits (the peak-to-valley height) may be in the range of 50 nm to about 1 micron deep, for example 350 nm to about 500 nm or about 200 nm to about 750 nm deep. When this pitted surface serves as a surface of a photovoltaic cell, light scattering is relatively uniform, approaching an ideal Lambertian surface. This advantageous texturing is achieved with removal of very little silicon, which makes it well-suited for use with a thin lamina such as that produced using the methods of Sivaram et al.

Figure 5A:
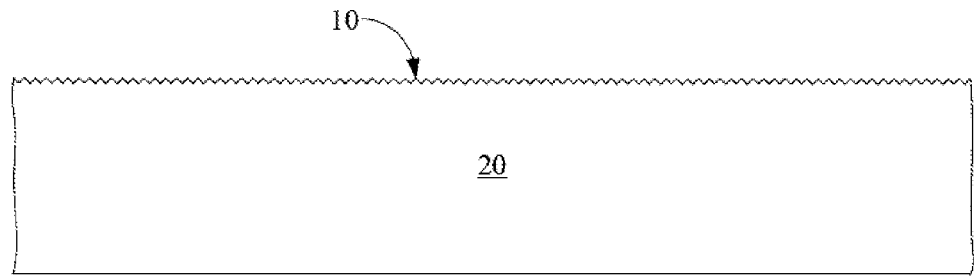
FIGS. 5a-5c are cross-sectional views illustrating translation of texture from a first surface to a cleave plane formed by ion implantation, and preservation of that texture in the resulting cleaved face, according to embodiments of the present invention.
Figure 5B:
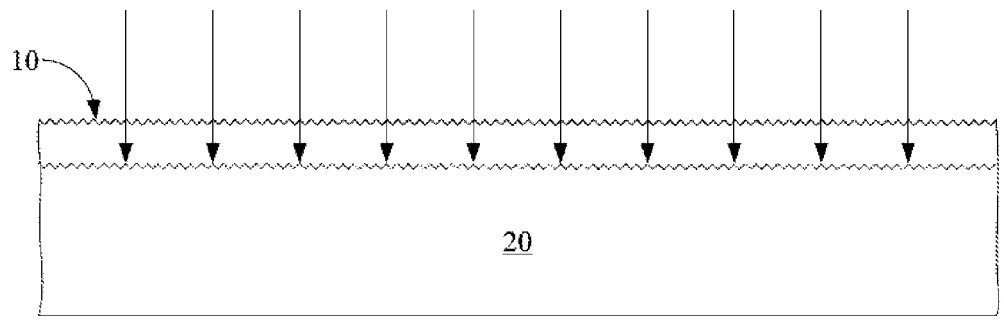
Figure 5C:
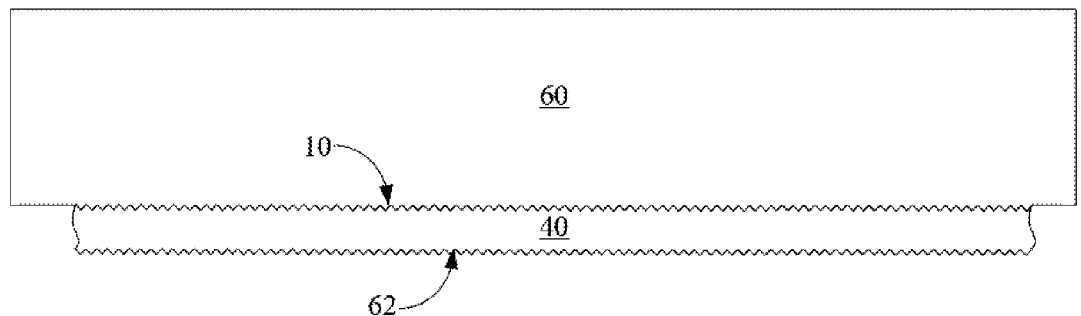

Recall that the method of Sivaram et al. includes creating a cleave plane in the donor wafer by implanting ions, for example hydrogen ions, through one surface of the wafer. This implant is highly conformal, reproducing surface texture in the resulting cleave plane. Referring to FIG. 5a, low-relief texture (shown schematically) is created at first surface 10 of the donor wafer 20, by firing frit paste or by some other method. When ion implantation is performed through first surface 10, the texture will be translated to the cleave plane 30, shown in FIG. 5b. Turning to FIG. 5c, following cleaving of lamina 40, relief at first surface 10 will be translated to second surface 62, which is created by cleaving. Lamina 40 is shown adhered to receiver element 60. The implant and cleaving conditions will determine how faithfully the texture of first surface 10 is reproduced at second surface 62. In this way a single texturing step can effectively produce texture at two opposing surfaces, both front and back.

Figure 6:
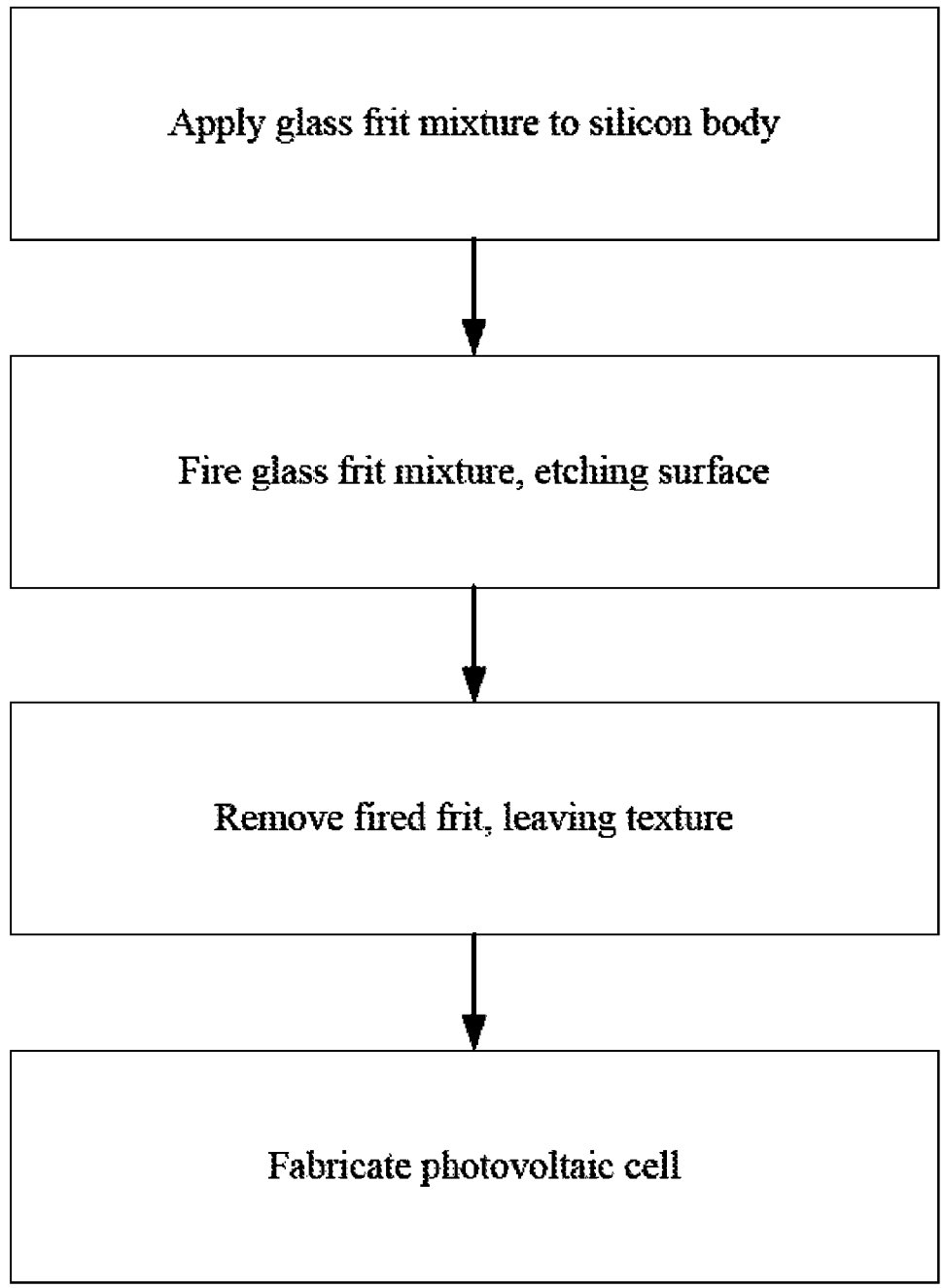
FIG. 6 is a flowchart illustrating a method according to embodiments of the present invention.

To summarize, texture can be formed at a surface of a photovoltaic cell, by a method comprising: applying a mixture containing glass frit to a first surface of a silicon body; firing the glass frit mixture, causing selective etching of silicon at the first surface; removing all of the fired glass frit, leaving the first surface textured; and fabricating the photovoltaic cell, wherein the photovoltaic cell comprises the textured first surface. These steps are illustrated in FIG. 6. Following removal of the fired glass frit, a receiver element is provided adhered to the first surface with zero, one, or more layers intervening.

Figure 7:
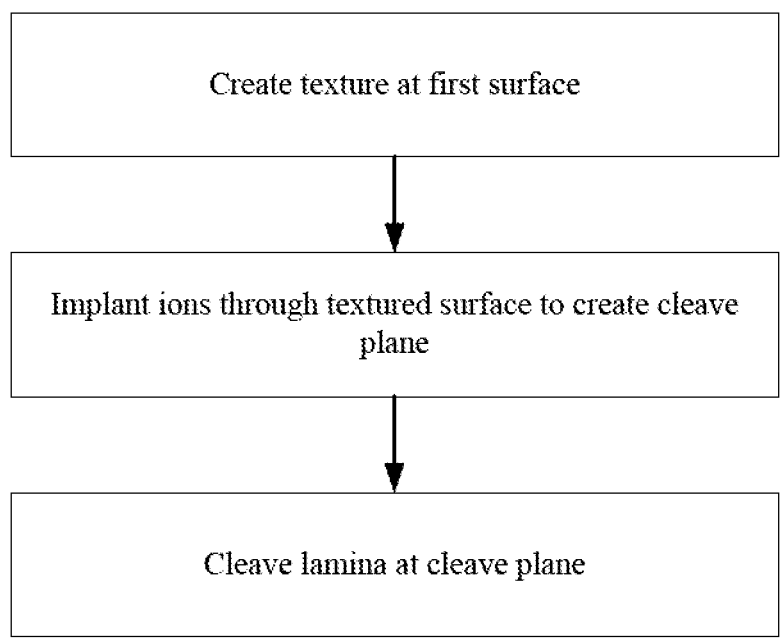
FIG. 7 is a flowchart illustrating another method according to embodiments of the present invention.

Texture can be created at opposing faces of a lamina by creating a first texture at a first surface of a donor body, wherein, for at least 50 percent of the area of the first surface, average peak-to-valley height is between about 100 nm and about 1500 nm, and average peak-to-peak distance is between about 140 nm and about 2100 nm; implanting ions through the textured first surface, thereby defining a cleave plane within the donor body; and cleaving the lamina from the donor body at the cleave plane, wherein the first surface of the donor body is a first surface of the lamina, and wherein a second surface of the lamina, the second surface opposite the first surface, is created by cleaving, and wherein, immediately following the cleaving step, the second surface has a second texture, wherein for at least 50 percent of the area of the second surface, average peak-to-valley height is between about 100 nm and about 1500 nm, and average peak-to-peak distance is between about 140 nm and about 2100 nm. FIG. 7 illustrates this method.

In some embodiments, texturing by applying and firing frit paste is not performed at the surface of the donor wafer, and instead is performed at the surface of the lamina created by cleaving, following the cleaving step. In this case, the silicon body being textured is a lamina having a thickness less than about ten microns.

For clarity, a detailed example of a photovoltaic assembly including a receiver element and a lamina having thickness between 0.2 and 100 microns, in which surface texture is created using frit paste to selectively etch silicon, and further in which fabricated surface texture is translated to a cleave plane by ion implantation, will be provided. For completeness, many materials, conditions, and steps will be described. It will be understood, however, that many of these details can be modified, augmented, or omitted while the results fall within the scope of the invention.

EXAMPLE: FORMING TEXTURE USING FRIT PASTE

The process begins with a donor body of an appropriate semiconductor material. An appropriate donor body may be a monocrystalline silicon wafer of any practical thickness, for example from about 200 to about 1000 microns thick. Typically the wafer has a <100> orientation, though wafers of other orientations may be used. In alternative embodiments, the donor wafer may be thicker; maximum thickness is limited only by practicalities of wafer handling. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 8A:
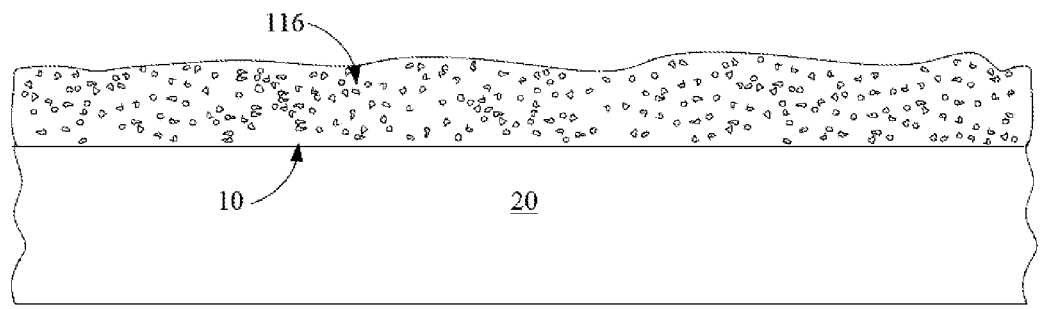
FIGS. 8a-8g are cross-sectional views illustrating stages in formation of a photovoltaic cell having textured surfaces formed according to an embodiment of the present invention.

Referring to FIG. 8a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. Wafer 20 may be doped to a concentration of between about $1\times10^{15}$ and about $1\times10^{18}$ dopant atoms/cm$^3$, for example about $1\times10^{17}$ dopant atoms/cm$^3$. Donor wafer 20 may be, for example, solar- or semiconductor-grade silicon.

First surface 10 of donor wafer 20 may be substantially planar. Frit paste 116 is applied, for example, by screen printing, though other methods, such as spin- or spray-coating, may be used. The frit paste is applied to a suitable thickness, for example between about 22 and about 30 microns thick. In general, frit paste is applied to at least 70 percent of the area of first surface 10, up to substantially all of first surface 10.

Frit paste includes an organic binder, a solvent, and frit. Many types are commercially available. The organic binder can be ethyl cellulose, and the solvent can be, for example, glycol ether or terpineol. The glass particles can be borosilicate glass, lead oxide glass, zinc oxide glass, magnesium oxide glass, bismuth oxide glass, zirconium oxide glass, aluminum oxide glass, cadmium oxide glass, calcium borosilicate glass, palladium oxide glass, barium borosilicate glass, etc. A frit composed of a material that has the property of etching silicon at elevated temperature, dissolving the silicon in the softened frit, should be selected. Frit may be about 5 microns across, or up to 10 microns or more. Frit pastes conventionally used in fabrication of metal contacts to photovoltaic cells have metal in the paste to allow it to be electrically conductive. For the purpose of creating surface texture, however, no metal is required in the paste. Since metal-containing pastes are frequently more expensive, a paste containing no metal may be preferred.

The silicon surface coated with frit paste is heated, drying the paste, burning out organics, and bringing the frit to its flow temperature. The solvent typically evaporates at about 120 to about 250 degrees C., while the organic binder evaporates at about 350 to about 360 degrees C. These steps may either be performed separately or combined. Drying may take up to two minutes, burnout of organics typically takes only a few seconds, and time at peak firing temperature may be seconds to minutes. Firing may be performed at, for example, about 650 to about 800 degrees C. Temperature may be ramped up quickly, for example at about 40 to 55 degrees C. per second. Cooling may be slower, for example about 10 degrees C/second. Temperatures and firing profiles will be varied according to the frit paste used, as will be understood by those skilled in the art.

As described earlier, when a transition temperature is reached, the frit becomes gel-like and, with higher temperature during firing, begins to flow under its own weight. Through capillary action, the frit, initially distributed throughout the paste, flows toward first surface 10. The fluid glass frit etches the silicon and dissolves it within the softened glass frit, forming pits at the surface. Areas of the silicon surface that do not contact frit are not affected.

During cooling, the etched silicon crystallizes in the glass frit. Once cooling is complete, the fired glass frit is etched, for example in an HF dip, or a buffered oxide etch, to remove the recrystallized material, including recrystallized silicon.

Figure 8B:
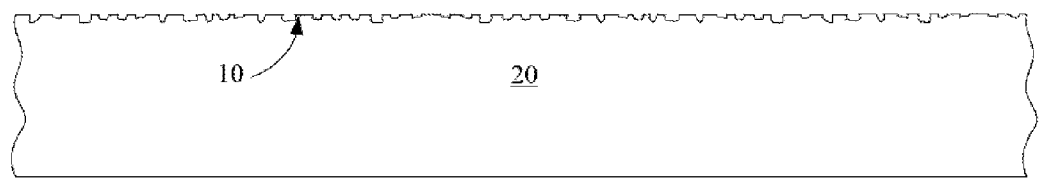

The resulting surface is randomly pitted, as illustrated in FIG. 8b. Pits may be, for example, about 350 to about 500 nm deep, with an average pitch (the distance from the center of one pit to the next) of about 0.5 micron to about 5 microns, for example about 2.5 to about 3 microns. Longer firing time and higher firing temperature produces larger and deeper pits. Frit composition affects pit size as well; more reactive materials will form larger pits at the same firing conditions.

Figure 8C:
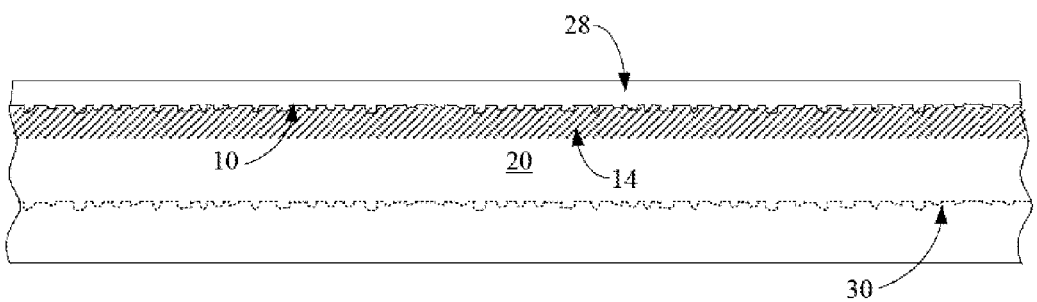

Turning to FIG. 8c, following texturing, first surface 10 may be heavily doped to some depth to the same conductivity type as wafer 20, forming heavily doped region 14; in this example, heavily doped region 14 is n-type. As wafer 20 has not yet been affixed to a receiver element, high temperatures can readily be tolerated at this stage of fabrication, and this doping step can be performed by any conventional method, including diffusion doping. Any conventional n-type dopant may be used, such as phosphorus or arsenic. Dopant concentration may be as desired, for example at least $1\times10^{18}$ dopant atoms/cm$^3$, for example between about $1\times10^{18}$ and $1\times10^{21}$ dopant atoms/cm$^3$. Doping and texturing can be performed in any order, but since most texturing methods remove some thickness of silicon, it may be preferred to form heavily doped n-type region 14 following texturing. Heavily doped region 14 will provide electrical contact to the base region in the completed device.

Next, in the present embodiment, a dielectric layer 28 is formed on first surface 10. As will be seen, in the present example first surface 10 will be the back of the completed photovoltaic cell, and a conductive material is to be formed on dielectric layer 28. The reflectivity of the conductive layer to be formed is enhanced if dielectric layer 28 is relatively thick. For example, if dielectric layer 28 is silicon dioxide, it may be between about 1000 and about 1500 to 2000 angstroms thick, while if dielectric layer 28 is silicon nitride, it may be between about 700 and about 800 angstroms thick, for example about 750 angstroms. This layer may be grown or deposited by any suitable method. A grown oxide layer 28 passivates first surface 10 better than if this layer is deposited. In some embodiments, a first thickness of dielectric layer 28 may be grown, while the rest is deposited.

In the next step, ions, preferably hydrogen or a combination of hydrogen and helium, are implanted into wafer 20 to define cleave plane 30, as described earlier. This implant may be performed using the implanter described in Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009; or of Purser et al. U.S. patent application Ser. No. 12/621,689, "Method and Apparatus for Modifying a Ribbon-Shaped Ion Beam," filed filed Nov. 19, 2009, all owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 or 6 microns. Note that the texture at first surface 10 is reproduced at cleave plane 30.

Figure 8D:
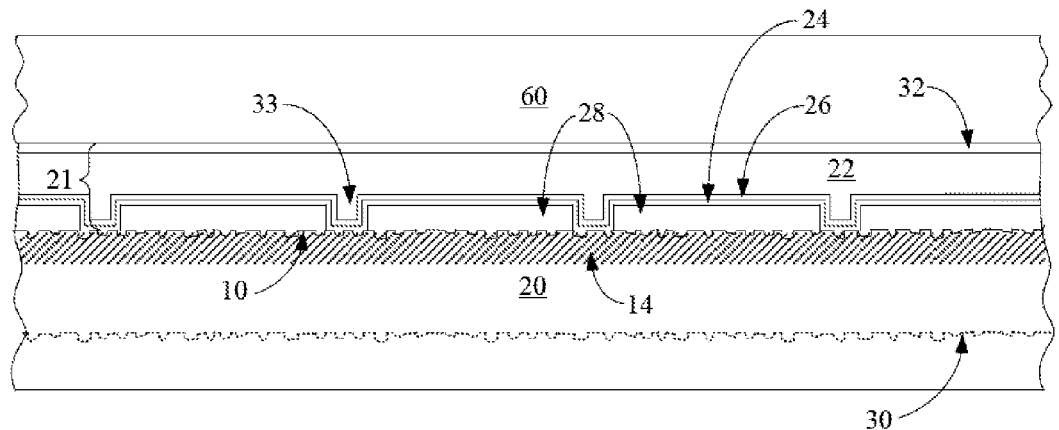

Turning to FIG. 8d, after implant, openings 33 are formed in dielectric layer 28 by any appropriate method, for example by laser scribing or screen printing. The size of openings 33 may be as desired, and will vary with dopant concentration, metal used for contacts, etc. In one embodiment, these openings may be about 40 microns square. Note that figures are not to scale.

A cobalt or titanium layer 24 is formed on dielectric layer 28 by any suitable method, for example by sputtering or thermal evaporation. This layer may have any desired thickness, for example between about 100 and about 400 angstroms, in some embodiments about 200 angstroms thick or less, for example about 100 angstroms. Layer 24 may be cobalt or titanium or an alloy thereof, for example, an alloy which is at least 90 atomic percent cobalt or titanium. Cobalt layer 24 is in immediate contact with first surface 10 of donor wafer 20 in vias 33; elsewhere it contacts dielectric layer 28.

In alternative embodiments, dielectric layer 28 is omitted, and titanium layer 24 is formed in immediate contact with donor wafer 20 at all points of first surface 10.

Non-reactive barrier layer 26 is formed on and in immediate contact with cobalt layer 24. This layer is formed by any suitable method, for example by sputtering or thermal evaporation. Non-reactive barrier layer 26 may be any material, or stack of materials, that will not react with silicon, is conductive, and will provide an effective barrier to the low-resistance layer to be formed in a later step. Suitable materials for non-reactive barrier layer include TiN, TiW, W, Ta, TaN, TaSiN, Ni, Mo, Zr, TaO, or alloys thereof. The thickness of non-reactive barrier layer 26 may range from, for example, between about 100 and about 3000 angstroms, for example between about 500 and about 1000 angstroms. In some embodiments this layer is about 700 angstroms thick.

Low-resistance layer 22 is formed on non-reactive barrier layer 26. This layer may be, for example, cobalt, silver, or tungsten or alloys thereof. In this example low-resistance layer 22 is cobalt or an alloy that is at least 90 atomic percent cobalt, formed by any suitable method. Cobalt layer 22 may be between about 5000 and about 20,000 angstroms thick, for example about 10,000 angstroms (1 micron) thick.

In this example an adhesion layer 32 is formed on low-resistance layer 22. Adhesion layer 32 is a material that will adhere to receiver element 60, for example titanium or an alloy of titanium, for example an alloy which is at least 90 atomic percent titanium. In alternative embodiments, adhesion layer 32 can be a suitable dielectric material, such as Kapton or some other polyimide. In some embodiments, adhesion layer 32 is between about 100 and about 2000 angstroms, for example about 400 angstroms. Cobalt layer 24, nonreactive barrier layer 26, low-resistance layer 22, and adhesion layer 32 make up intermetal stack 21.

Next a receiver element adhered to the donor wafer is provided. This receiver element 60 will provide structural support to the thin lamina to be cleaved from donor wafer 20 at cleave plane 30. As described by Sivaram et al., this receiver element can be a rigid or semi-rigid material, such as glass, metal, semiconductor, etc., which is bonded to donor wafer 20. In this example the intermetal stack 21 is disposed between donor wafer 20 and the receiver element. In other embodiments, the receiver element can be a preformed sheet of polyimide, as described in Agarwal et al., U.S. patent application Ser. No. 12/493,195, "Method to Form a Thin Semiconductor Lamina Adhered to a Flexible Substrate," filed Jun. 27, 2009, owned by the assignee of the present application and hereby incorporated by reference. Alternatively, a receiver element can be constructed by applying or accreting a material or stack of materials to first surface 10, or, in the example described, to a layer on or above first surface 10, such as adhesion layer 32. Agarwal et al., for example, describe forming a receiver element by applying liquid polyimide to an intermetal stack formed on a donor wafer, then curing the liquid polyimide to form a polyimide receiver element. A constructed receiver element could be formed of other suitable materials as well. This receiver element is formed from the material or stack of materials thus applied, and will have a final thickness of at least 50 microns.

A receiver element 60 is provided adhered to donor wafer 20, with dielectric layer 28, titanium layer 24, non-reactive barrier layer 26, low-resistance layer 22, and adhesion layer 32 intervening. Receiver element 60 may be a laminate structure, including layers of different materials.

Figure 8E:
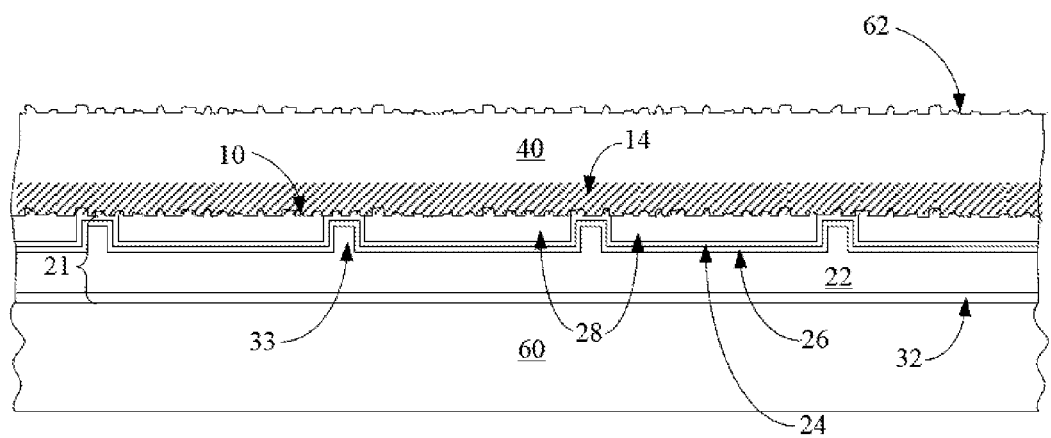

Referring to FIG. 8e, which shows the structure inverted with receiver element 60 on the bottom, a thermal step causes lamina 40 to cleave from the donor wafer at the cleave plane.

In some embodiments, this cleaving step may be combined with a bonding step. Cleaving is achieved in this example by exfoliation, which may be achieved at temperatures between, for example, about 350 and about 650 degrees C. In general, exfoliation proceeds more rapidly at higher temperature. The thickness of lamina 40 is determined by the depth of cleave plane 30. In many embodiments, the thickness of lamina 40 is between about 1 and about 10 microns, for example between about 2 and about 5 microns, for example about 4.5 microns. Bonding and exfoliation may be achieved using methods described in Agarwal et al., U.S. patent application Ser. No. 12/335,479, "Methods of Transferring a Lamina to a Receiver Element," filed Dec. 15, 2008, owned by the assignee of the present application and hereby incorporated by reference.

During relatively high-temperature steps, such as the exfoliation of lamina 40, the portions of cobalt layer 24 in immediate contact with silicon lamina 40 will react to form cobalt silicide. If dielectric layer 28 was included, cobalt silicide is formed where first surface 10 of lamina 40 was exposed in vias 33. If dielectric layer 28 was omitted, in general all of the cobalt of cobalt layer 24 will be consumed, forming a blanket of cobalt silicide.

Second surface 62 has been created by exfoliation. Second surface 62 will typically have some damage, with decreased carrier mobility in this region, and steps may be taken to remove or repair this damage. Some damage may be removed by wet etching, for example with KOH or tetramethylammonium hydroxide (TMAH). Some thickness of silicon will be removed by this etch, for example between about 3000 to 7000 angstroms or more. In general a deeper implant (resulting in a thicker lamina) will have a thicker damaged zone to be removed. An etch step intended to enhance texture at this surface to increase internal reflection may be combined with the damage-removal etch, or may be performed independently.

The conformal ion implantation step to form the cleave plane has translated the texture composed of pits formed at first surface 10 to second surface 62. If an etch is performed to remove damage, in general the damage and the damage etch will be conformal, such that the relief at second surface 62 will be preserved following the etch. The pits of first surface 10 will become protrusions at second surface 62. An additional texturing etch may be performed if desired.

In some embodiments, an anneal may be performed, for example following the damage-removal etch, to repair implant damage within the body of lamina 40. Annealing may be performed, for example, at 500 degrees C. or greater, for example at 550, 600, 650, 700 degrees C. or greater, up to about 950 degrees C. The structure may be annealed, for example, at about 650 degrees C. for about 45 minutes, or at about 800 degrees for about two minutes, or at about 950 degrees for 60 seconds or less. In other embodiments, no damage anneal is performed.

Figure 8F:
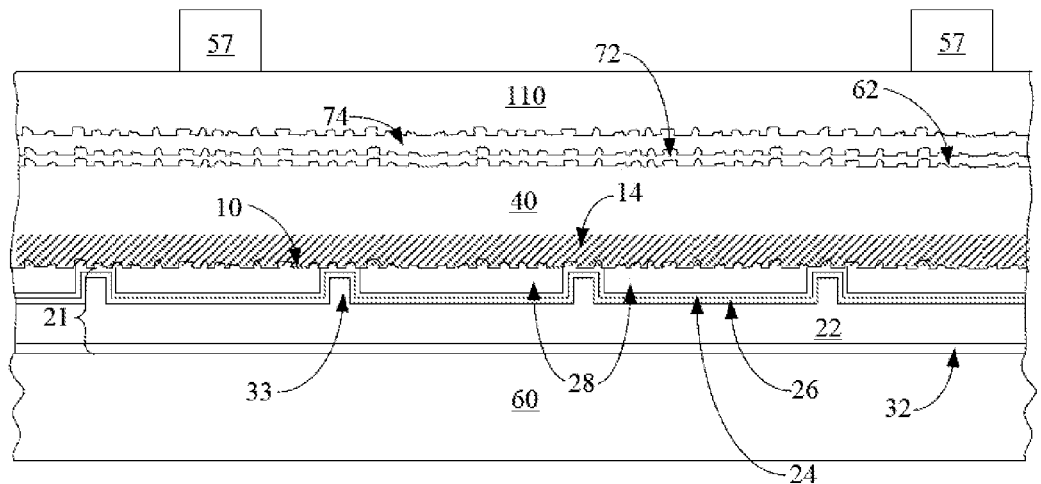

Referring to FIG. 8f, if any native oxide (not shown) has formed on second surface 62, it may be removed by any conventional cleaning step, for example by etching in dilute hydrofluoric acid. After cleaning, a silicon layer is deposited on second surface 62. This layer 74 includes heavily doped silicon, and may be amorphous, microcrystalline, nanocrystalline, or polycrystalline silicon, or a stack including any combination of these. This layer or stack may have a thickness, for example, between about 50 and about 350 angstroms. FIG. 8f shows an embodiment that includes intrinsic amorphous silicon layer 72 between second surface 62 and doped layer 74. In other embodiments, layer 72 may be omitted. In this example, heavily doped silicon layer 74 is doped p-type, opposite the conductivity type of lightly doped n-type lamina 40, and serves as the emitter of the photovoltaic cell being formed, while lightly doped n-type lamina 40 comprises the base region. If included, layer 72 is sufficiently thin that it does not impede electrical connection between lamina 40 and doped silicon layer 74.

A transparent conductive oxide (TCO) layer 110 is formed on heavily doped silicon layer 74. Appropriate materials for TCO 110 include indium tin oxide, as well as aluminum-doped zinc oxide, tin oxide, titanium oxide, etc.; this layer may be, for example, about 1000 angstroms thick, and serves as both a top electrode and an antireflective layer. In alternative embodiments, an additional antireflective layer (not shown) may be formed on top of TCO 110.

A photovoltaic cell has been formed, including lightly doped n-type lamina 40, which comprises the base of the cell, and heavily doped p-type amorphous silicon layer 74, which serves as the emitter of the cell. Heavily doped n-type region 14 will improve electrical contact to the cell. Electrical contact must be made to both faces of the cell. This contact can be formed using a variety of methods, including those described in Petti et al., U.S. patent application Ser. No. 12/331,376, "Front Connected Photovoltaic Assembly and Associated Methods," filed Dec. 9, 2008; and Petti et al., U.S. patent application Ser. No. 12/407,064, "Method to Make Electrical Contact to a Bonded Face of a Photovoltaic Cell," filed Mar. 19, 2009, hereinafter the '064 application, both owned by the assignee of the present application and both hereby incorporated by reference.

Figure 8G:
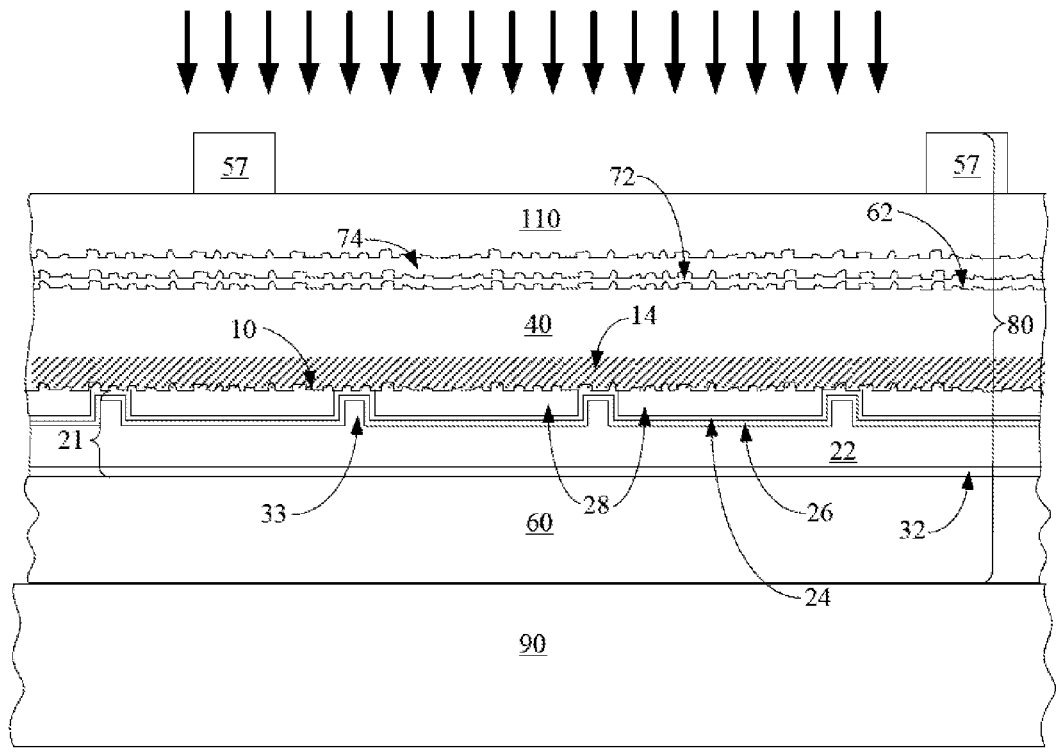

FIG. 8g shows completed photovoltaic assembly 80, which includes a photovoltaic cell and receiver element 60. In alternative embodiments, by changing the dopants used, heavily doped region 14 may serve as the emitter, at first surface 10, while heavily doped silicon layer 74 serves as a contact to the base region. Incident light (indicated by arrows) falls on TCO 110, enters the cell at heavily doped p-type amorphous silicon layer 74, enters lamina 40 at second surface 62, and travels through lamina 40. In this embodiment, receiver element 60 serves as a substrate. If receiver element 60 has, for example, a widest dimension about the same as that of lamina 40, the receiver element 60 and lamina 40, and associated layers, form a photovoltaic assembly 80. Multiple photovoltaic assemblies 80 can be formed and affixed to a supporting substrate 90 or, alternatively, a supporting superstrate (not shown). Additional fabrication details of such a cell are provided in Herner, U.S. patent application Ser. No. 12/540,463, "Intermetal Stack for Use in a Photovoltaic Device," filed Aug. 13, 2009, owned by the assignee of the present application and hereby incorporated by reference.

Figure 9:
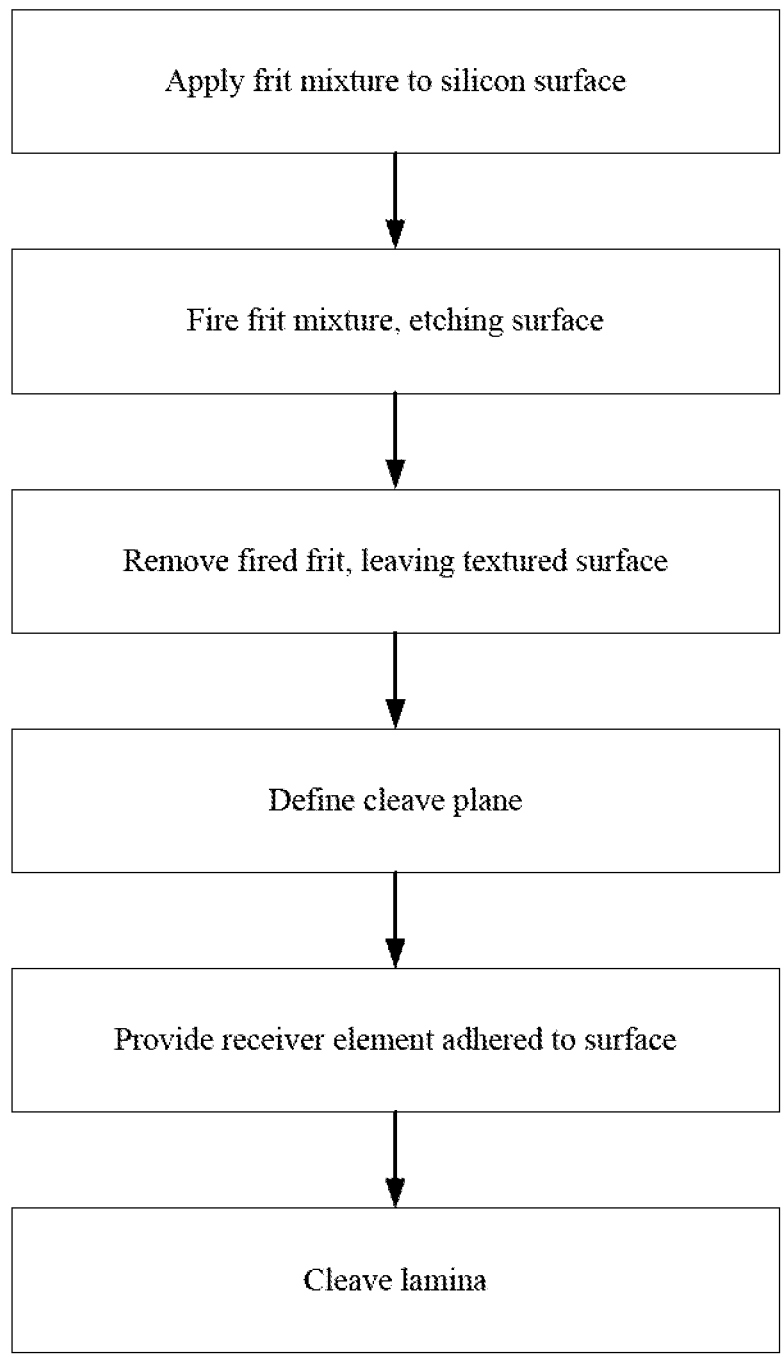
FIG. 9 is a flowchart illustrating still another method according to embodiments of the present invention.

In this example, texture was created at a surface of a photovoltaic cell by applying a mixture containing glass frit to a first surface of a silicon donor wafer; firing the glass frit mixture, causing selective etching of silicon at the first surface; removing all of the fired glass frit, leaving the first surface textured; defining a cleave plane in the donor wafer; providing a receiver element adhered to the first surface of the donor wafer with zero, one, or more layers intervening; and cleaving a lamina from the donor wafer at the cleave plane, wherein the lamina remains affixed to the receiver element, wherein the lamina is suitable for use in a photovoltaic cell. A photovoltaic cell may then be fabricated, the photovoltaic cell comprising the lamina. These steps are summarized in FIG. 9.

In this embodiment, texture was formed using frit paste at first surface 10, and this texture was translated to second surface 62 by ion implantation. In alternative embodiments, creating texture by depositing and firing frit paste on a silicon surface can be performed only at second surface 62, and not at first surface 10, or can be performed at both first surface 10 and second surface 62.

Example: Forming Texture by Crystallographically Selective Etch

In the previous example, low-relief texture, having peak-to-valley height between about 100 nm and about 1500 nm at both the first surface and the second surface, was created by selective etching using frit paste. Low-relief texture, having similar peak-to-valley distance, may be formed in other ways as well. An etchant that shows etch selectivity between the (100) and (111) crystallographic planes may be used. Such etchants include, for example, KOH or TMAH.

Figure 10A:
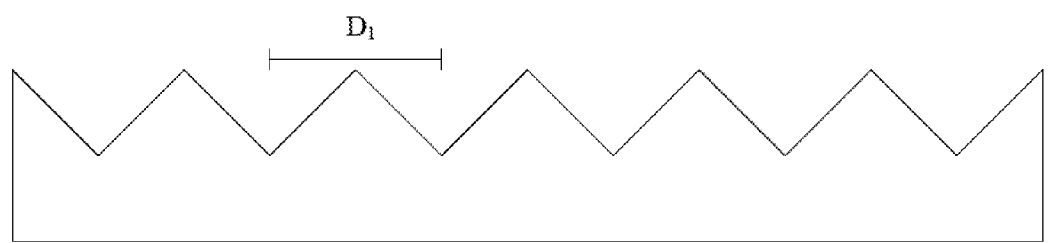
FIGS. 10a and 10b are cross-sectional views illustrating relative removal of silicon with sparse and dense initiation points.
Figure 10B:
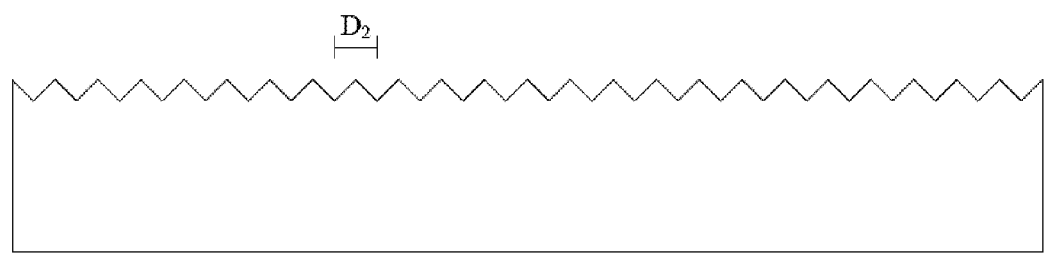

It is known to use KOH as an etchant to create surface texture in photovoltaic cells by etching silicon. This etch is highly selective, etching the (100) and (110) planes at a higher rate than the (111) plane. Etching a (100)-oriented wafer with a KOH solution at elevated temperature will yield a series of small pyramids. In a conventional cell formed from a silicon wafer, which may be hundreds of microns thick, the peak-to-valley height of these pyramids may be three to ten microns or more. This peak-to-valley height is determined by the density of initiation sites, at which etching begins. As shown in FIG. 10$a$, where each initiation site is a large distance $D_1$ from the adjacent one, more silicon must be etched before the pyramids meet than in FIG. 10$b$, where initiation sites are at closer distance $D_2$. By adjusting etch parameters, such as dilution and temperature, etch initiation sites may be made more dense, creating pyramids having a peak-to-valley height between about 100 and about 1500 nm. For example, D. L. King and E. Buck, "Experimental optimization of an anisotropic etching process for random texturization of silicon solar cells," Proc. 10th Photovoltaic Solar Energy Conference, Lisbon, April 1991, pp. 303-308, describe etch conditions using a variety of parameters. In this paper, it was shown that etching at 90 degrees C. for 30 minutes with a solution of 5 percent KOH and 20 percent IPA produced larger pyramids, while etching at 70 degrees C. for 30 minutes with a solution of 1.5 percent KOH and 3.8 percent IPA produced much smaller pyramids.

Figure 11A:
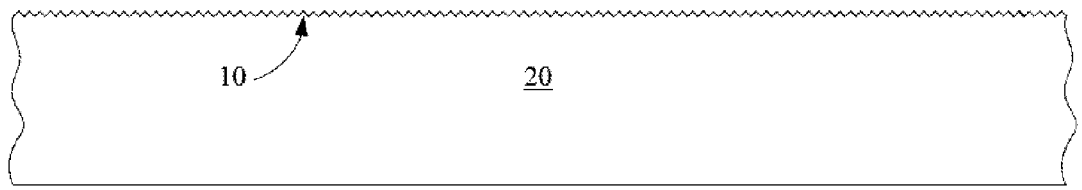
FIGS. 11a-11c are cross-sectional views illustrating stages in formation of a photovoltaic cell having textured surfaces formed according to another embodiment of the present invention.
Figure 11B:
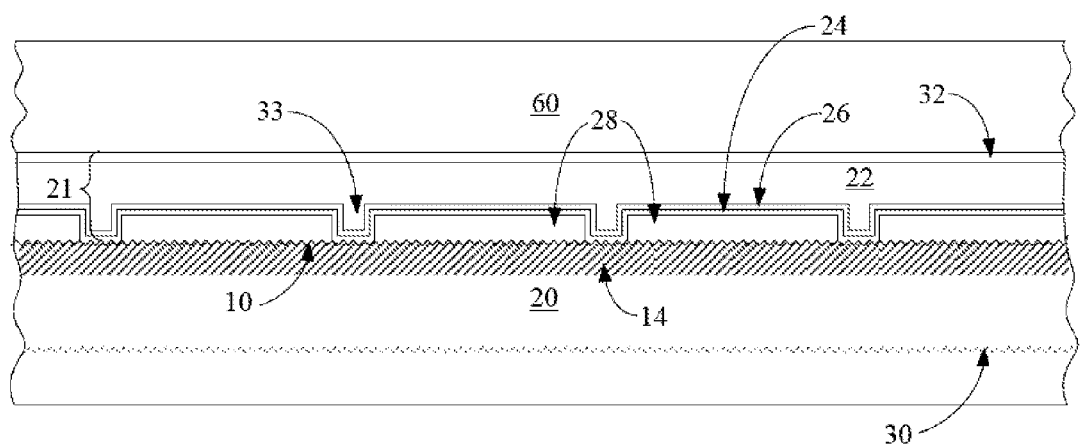
Figure 11C:
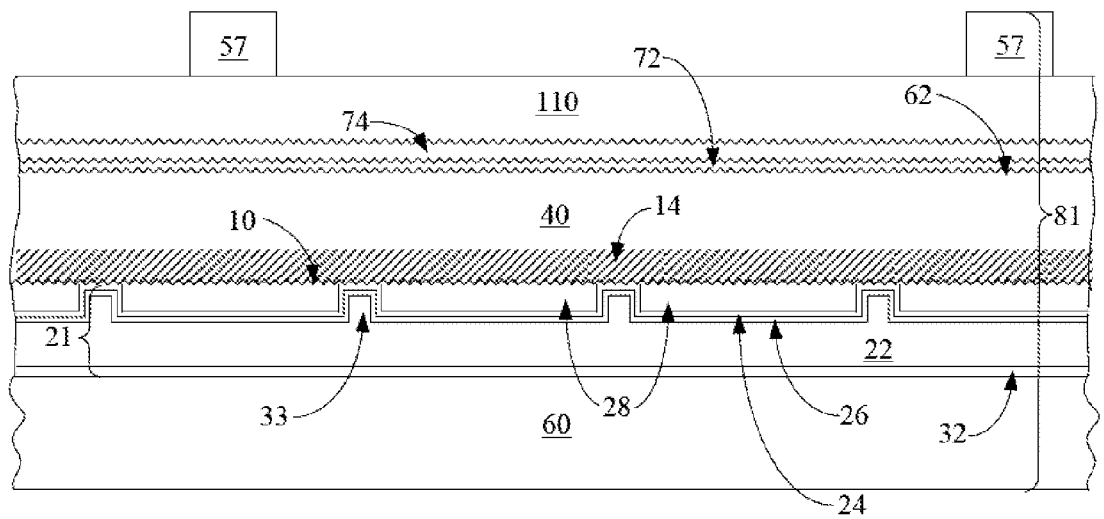

In one embodiment, then, a photovoltaic cell can be formed as in the prior embodiment. Turning to FIG. 11$a$, the first surface 10 of a donor wafer 20 is etched using a KOH or TMAH etch, or some other crystallographically selective etch, to form pyramids. The pyramids are shown regularly spaced for simplicity; in reality their spacing will be random. At first surface 10, following this texturing etch, average peak-to-valley height is between about 100 nm and about 1500 nm, and average peak-to-peak distance is between about 140 nm and about 2100 nm. In general, all of first surface 10 has this texture. In other embodiments, less than the entire surface, for example at least 80 percent, or at least 50 percent, may have this texture.

Turning to FIG. 11$b$, as in the prior embodiment, following the texturing step, first surface 10 is doped to form heavily doped region 14. In the present example, lightly doped donor wafer 20 is n-type, as is heavily doped region 14. Dielectric layer 28 is deposited, an implant step forms cleave plane 30, and vias 33 are formed. Cobalt layer 24, non-reactive barrier layer 26, low-resistance layer 22, and adhesion layer 32 are formed as before. A receiver element 60, which may be a rigid or semi-rigid material such as glass, metal, or semiconductor, or may be constructed in situ from an applied material such as polyimide or some other suitable material, is provided.

Turning to FIG. 11$c$, again as in the prior embodiment, lamina 40 is cleaved from the donor wafer, creating second surface 62. Note that the texture formed at first surface 1 has been translated to second surface 62 by the ion implantation step. At second surface 62, following cleaving, average peak-to-valley height is between about 100 nm and about 1500 nm, and average peak-to-peak distance is between about 140 nm and about 2100 nm. In general, all of first surface 62 has this texture. In other embodiments, less than the entire surface, for example at least 80 percent, or at least 50 percent, may have this texture. An additional etch step may or may not be performed at second surface 62 to remove damaged silicon or to enhance surface texture. An anneal may be performed to remove lattice damage caused by the implant step.

Intrinsic amorphous silicon layer 72 and heavily doped amorphous silicon layer 74 are deposited, as is TCO 110. Gridlines 57 are formed, completing photovoltaic assembly 81.

Figure 12:
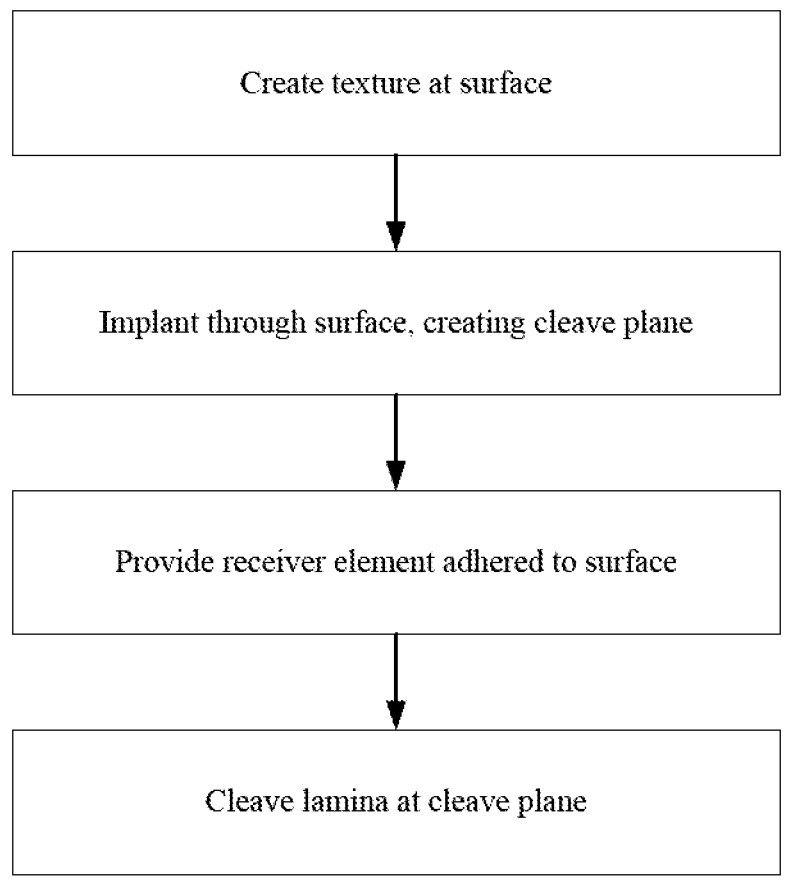
FIG. 12 is a flowchart illustrating yet another method according to embodiments of the present invention.

A lamina having textured opposing surfaces may be formed by a method comprising creating a first texture at a first surface of a donor body, wherein, for at least 50 percent of the area of the first surface, average peak-to-valley height is between about 100 nm and about 1500 nm, and average peak-to-peak distance is between about 140 nm and about 2100 nm; implanting ions through the textured first surface, thereby defining a cleave plane within the donor body; providing a receiver element adhered to the first surface of the donor wafer with zero, one or more layers intervening; and cleaving a lamina from the donor body at the cleave plane, wherein the first surface of the donor body is a first surface of the lamina, and wherein a second surface of the lamina, the second surface opposite the first surface, is created by cleaving, and wherein, immediately following the cleaving step, the second surface has a second texture, wherein for at least 50 percent of the area of the second surface, average peak-to-valley height is between about 100 nm and about 1500 nm, and average peak-to-peak distance is between about 140 nm and about 2100 nm, and wherein the lamina is suitable for use in a photovoltaic cell. FIG. 12 illustrates this method.

This application has described forming texture at either surface of a lamina by etching using frit paste or using a crystallographic etch. Other methods may be used, including those described by Herner, "Method to Texture a Lamina Surface Within a Photovoltaic Cell," U.S. patent application Ser. No. 12/343,420, filed Dec. 23, 2008, owned by the assignee of the present application and hereby incorporated by reference.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to form texture at a surface of a photovoltaic cell, the method comprising the steps of:

applying a mixture containing glass frit to a first surface of a silicon body;

firing the glass frit mixture, wherein firing the glass frit mixture causes selective etching of silicon at the first surface;

removing all of the fired glass frit, leaving the first surface textured; and fabricating the photovoltaic cell, wherein the photovoltaic cell comprises the textured first surface.

2. The method of claim 1 wherein the glass frit is one or more of lead oxide glass, bismuth oxide glass, zinc oxide glass, aluminum oxide glass, cadmium oxide glass, magnesium oxide glass, borosilicate glass, calcium borosilicate glass, palladium oxide glass, barium borosilicate glass, or zirconium oxide glass.

3. The method of claim 1 wherein the textured first surface has an average peak-to-valley height between about 50 nm and about 1 micron.

4. The method of claim 1 wherein, at the textured first surface, the average pitch of the textured first surface is between about 0.5 microns and about 5 microns.

5. The method of claim 1 wherein the silicon body is monocrystalline silicon.

6. The method of claim 1 wherein, in the completed photovoltaic cell, the first surface is a surface of a silicon lamina having a thickness between about 1 microns and about 10 microns.

7. The method of claim 6 further comprising, following the step of removing all of the fired glass frit, providing a receiver element adhered to the first surface with zero, one, or more layers intervening.

8. The method of claim 6 further comprising, before the application of glass frit mixture, cleaving the silicon lamina from a silicon wafer, wherein the first surface is created during the cleaving step.

9. The method of claim 1 wherein the silicon body is a lamina having a thickness less than about ten microns.

10. The method of claim 1 wherein the step of applying a mixture of glass frit comprises applying the mixture of glass frit to at least 70 percent of the area of the first surface.

11. A method to texture opposing surfaces of a lamina, the method comprising the steps of:

creating a first texture at a first surface of a donor body, wherein, for at least 50 percent of the area of the first surface, average peak-to-valley height is between about 100 nm and about 1500 nm, and average peak-to-peak distance is between about 140 nm and about 2100 nm;

implanting ions through the textured first surface, thereby defining a cleave plane within the donor body; and cleaving the lamina from the donor body at the cleave plane, wherein the first surface of the donor body is a first surface of the lamina, and wherein a second surface of the lamina, the second surface opposite the first surface, is created by cleaving, and wherein, immediately following the cleaving step, the second surface has a second texture, wherein for at least 50 percent of the area of the second surface, average peak-to-valley height is between about 100 nm and about 1500 nm, and average peak-to-peak distance is between about 140 nm and about 2100 nm;

wherein the step of creating texture at a first surface comprises applying a mixture containing glass frit to the first surface.

12. The method of claim 11 wherein lamina thickness is between about 1 micron and about 10 microns.

13. The method of claim 11 wherein, for at least 80 percent of the area of the first surface, average peak-to-valley height is between about 100 nm and about 1000 nm and average peak-to-peak distance is between about 140 nm and about 1400 nm.

14. The method of claim 13 wherein the step of creating the first texture at the first surface comprises etching at the first surface with a selective etchant, wherein the selective etchant etches the (100) plane at a higher etch rate than the (111) plane.

15. The method of claim 11 further comprising fabricating a photovoltaic cell, the photovoltaic cell comprising the lamina.

16. The method of claim 15 wherein the lamina comprises a base of the photovoltaic cell.

17. The method of claim 15 further comprising, between the implanting step and the cleaving step, providing a receiver element adhered to the first surface of the donor body with zero, one, or more layers intervening.

18. The method of claim 17 wherein the step of providing a receiver element adhered to the first surface of the donor body with zero, one, or more layers intervening comprises applying a material or stack of materials to the first surface, or to a layer on or above the first surface, wherein the receiver element is formed from the material or stack of materials.

19. The method of claim 18 wherein the receiver element has a final thickness of at least 50 microns.

20. The method of claim 11 wherein, for at least 50 percent of the area of the first surface, average peak-to-valley height is between about 300 nm and about 1000 nm.

* * * * *

UNITED STATES PATENT AND TRADEMARK OFFICE
CERTIFICATE OF CORRECTION

| | | |
|---|---|---|
| PATENT NO. | : 8,563,352 B2 | Page 1 of 1 |
| APPLICATION NO. | : 12/750635 | |
| DATED | : October 22, 2013 | |
| INVENTOR(S) | : Mohamed M. Hilali and S. Brad Herner | |

It is certified that error appears in the above-identified patent and that said Letters Patent is hereby corrected as shown below:

On the title page, item (12) under United States Patent - Hiliali, et al. should read as follows:

Hilali, et al.

On the title page, at (75) Inventors, please delete "Hiliali" and insert --Hilali--.

Signed and Sealed this
Eleventh Day of February, 2014

Michelle K. Lee
*Deputy Director of the United States Patent and Trademark Office*